(12) United States Patent
Kim et al.

(10) Patent No.: US 9,437,563 B2
(45) Date of Patent: Sep. 6, 2016

(54) BUMP STRUCTURES IN SEMICONDUCTOR PACKAGES AND METHODS OF FABRICATING THE SAME

(71) Applicant: SK hynix Inc., Icheon-si, Gyeonggi-do (KR)

(72) Inventors: Taek Joong Kim, Seoul (KR); Yong Su Han, Icheon-si (KR)

(73) Assignee: SK HYNIX INC., Icheon-Si (KR)

( * ) Notice: Subject to any disclaimer, the term of this patent is extended or adjusted under 35 U.S.C. 154(b) by 73 days.

(21) Appl. No.: 14/546,815

(22) Filed: Nov. 18, 2014

(65) Prior Publication Data

US 2015/0072518 A1    Mar. 12, 2015

Related U.S. Application Data

(62) Division of application No. 13/846,570, filed on Mar. 18, 2013, now Pat. No. 8,922,009.

(30) Foreign Application Priority Data

Aug. 30, 2012  (KR) .......... 10-2012-0095770

(51) Int. Cl.
*H01L 23/00*        (2006.01)

(52) U.S. Cl.
CPC .............. *H01L 24/11* (2013.01); *H01L 24/03* (2013.01); *H01L 24/05* (2013.01); *H01L 24/13* (2013.01); *H01L 2224/03462* (2013.01); *H01L 2224/03912* (2013.01); *H01L 2224/0401* (2013.01); *H01L 2224/05026* (2013.01); *H01L 2224/05557* (2013.01); *H01L 2224/05572* (2013.01); *H01L 2224/05624* (2013.01); *H01L 2224/05644* (2013.01); *H01L 2224/05647* (2013.01); *H01L 2224/05655* (2013.01); *H01L 2224/05666* (2013.01); *H01L 2224/10126* (2013.01); *H01L 2224/1147* (2013.01); *H01L 2224/1182* (2013.01); *H01L 2224/11462* (2013.01); *H01L 2224/11831* (2013.01); *H01L 2224/13006* (2013.01); *H01L 2224/13018* (2013.01); *H01L 2224/1357* (2013.01); *H01L 2224/13147* (2013.01); *H01L 2224/13565* (2013.01); *H01L 2224/13686* (2013.01)

(58) Field of Classification Search
CPC ....... H01L 24/11; H01L 24/13; H01L 24/03; H01L 24/05
See application file for complete search history.

(56) References Cited

U.S. PATENT DOCUMENTS 8,664,760 B2 *  3/2014  Yu .................... H01L 23/147
                                                    257/737

\* cited by examiner

*Primary Examiner* — Long Pham
(74) *Attorney, Agent, or Firm* — William Park & Associates Ltd.

(57) ABSTRACT

The bump structure includes a metal pattern disposed on an electrode pad to have a vertical sidewall and a recessed region surrounded by the vertical sidewalls, a metal post including a lower portion inserted into the recessed region and a protruded portion upwardly extending from the lower portion, and a passivation spacer on a sidewall of the metal post. The metal post is electrically connected to the electrode pad.

9 Claims, 7 Drawing Sheets

BUMP STRUCTURES IN SEMICONDUCTOR PACKAGES AND METHODS OF FABRICATING THE SAME

CROSS-REFERENCE TO RELATED APPLICATION

The present application claims priority under 35 U.S.C 119(a) to Korean Application No. 10-2012-0095770, filed on Aug. 30, 2012, in the Korean intellectual property Office, which is incorporated herein by reference in its entirety.

BACKGROUND

Embodiments of the present disclosure generally relate to semiconductor packages and methods of fabricating the same and, more particularly, to bump structures in semiconductor packages and methods of fabricating the same.

Electronic devices employed in electronic systems may include various circuit elements such as active elements and/or passive elements. The circuit elements may be integrated in and/or on a semiconductor substrate, thereby constituting an electronic device (also, referred to as a semiconductor chip or a semiconductor die). The electronic device may be mounted on a printed circuit board (PCB) or a package substrate to produce an electronic device package, for example, a semiconductor package. The package substrate may include circuit interconnections such as silicon interposers. The electronic device package may be mounted on a main board to constitute an electronic system, for example, computers, mobile systems, or data storage media.

Bumps are widely used in fabrication of the electronic device packages. The bumps may electrically connect the semiconductor chip in the electronic device package to the package substrate or may electrically connect the semiconductor chips in a single electronic device package to each other. For example, the bumps may be employed in flip chip packages to realize various stack structures of the semiconductor chips and/or to increase the number of input/output (I/O) terminals of the flip chip packages.

As the semiconductor chips become more highly integrated and become scaled down, the sizes and pitches of the bumps have been continuously reduced. In fabrication of the bumps, a metal material may be introduced into the bumps to electrically connect the semiconductor chips to each other. For example, the fabrication of the bumps may include depositing a seed metal layer which is used to grow the metal material. The seed metal layer may be removed using a wet etch process in a subsequent process. In such a case, the seed metal layer may be over-etched by increasing the wet etch time in order to completely remove the seed metal layer. However, if the seed metal layer is over-etched, undercut regions may be formed under the bumps, which may laterally grow in size thereby causing failures. If the seed metal layer is over-etched, contact areas between the bumps and the underlying layer may be reduced to increase contact resistance of the bumps.

SUMMARY

Various embodiments are directed to bump structures in semiconductor packages and methods of fabricating the same.

According to some embodiments, a bump structure includes a metal pattern disposed on an electrode pad to have a cylindrical shape including a vertical sidewall and a recessed region surrounded by the vertical sidewalls, a metal post including a lower portion inserted into the recessed region and a protruded portion upwardly extending from the lower portion, and a passivation spacer on a sidewall of the metal post. The metal post is electrically connected to the electrode pad.

In some embodiments, the vertical sidewall of the metal pattern may have a protrusion that outwardly extends from a sidewall of the metal post.

In some embodiments, the protrusion of the vertical sidewall of the metal pattern may laterally extend from the sidewall of the metal post.

In some embodiments, an outer sidewall of the passivation spacer may have an inclined profile such that a horizontal width of the passivation spacer is gradually reduced toward an upper end thereof.

In some embodiments, the metal pattern may be vertically aligned with the metal post such that an outer sidewall of the metal pattern is located in a vertical plane extending from the sidewall of the metal post.

In some embodiments, the passivation spacer may partially cover the sidewall of the protruded portion of the metal post.

In some embodiments, the passivation spacer may cover an entire portion of the sidewall of the protruded portion of the metal post.

According to further embodiments, a method of fabricating a bump structure includes forming an insulation layer on a substrate. The insulation layer is formed to include an opening that exposes an electrode pad on the substrate. A metal film is formed on the insulation layer and in the opening of the insulation layer. A mask pattern is then formed on the insulation layer to include an opening that exposes the metal film on the electrode pad. A metal post is formed on the metal film exposed by the opening of the mask pattern. A passivation spacer is formed on a sidewall of the metal post. The metal film on the insulation layer is removed to form a metal pattern on the electrode pad. The metal pattern is formed to include a vertical sidewall.

In some embodiments, the metal post may be formed to upwardly protrude from a top surface of the mask pattern.

In some embodiments, the mask pattern may be formed of a photoresist material.

In some embodiments, the metal post may be formed to include a copper material.

In some embodiments, forming the passivation spacer may include removing the mask pattern, forming a passivation layer on the metal film and the metal post, and etching back the passivation layer to leave a portion of the passivation layer on the sidewall of the metal post.

In some embodiments, the passivation layer may be formed to include an oxide layer.

In some embodiments, the passivation layer may be etched back using a dry etch process.

In some embodiments, the vertical sidewall of the metal pattern may be formed to include a protrusion that outwardly extends from a sidewall of the metal post.

In some embodiments, the protrusion of the vertical sidewall of the metal pattern may be formed to laterally extend from the sidewall of the metal post.

In some embodiments, the metal pattern may be formed such that an outer sidewall of the metal pattern is located in a vertical plane extending from the sidewall of the metal post.

In some embodiments, the passivation spacer may be formed to cover a portion of the sidewall of the metal post.

In some embodiments, an outer sidewall of the passivation spacer may be formed to have an inclined profile such that a horizontal width of the passivation spacer is gradually reduced toward an upper end thereof.

In some embodiments, the passivation spacer may be formed to cover an entire portion of the sidewall of the metal post.

BRIEF DESCRIPTION OF THE DRAWINGS

Embodiments of the present invention will become more apparent in view of the attached drawings and accompanying detailed description, in which.

DETAILED DESCRIPTION

Various embodiments of the present invention will be described hereinafter with reference to the accompanying drawings. However, the embodiments described herein are for illustrative purposes only and are not intended to limit the scope of the inventive concept.

Figure 1:
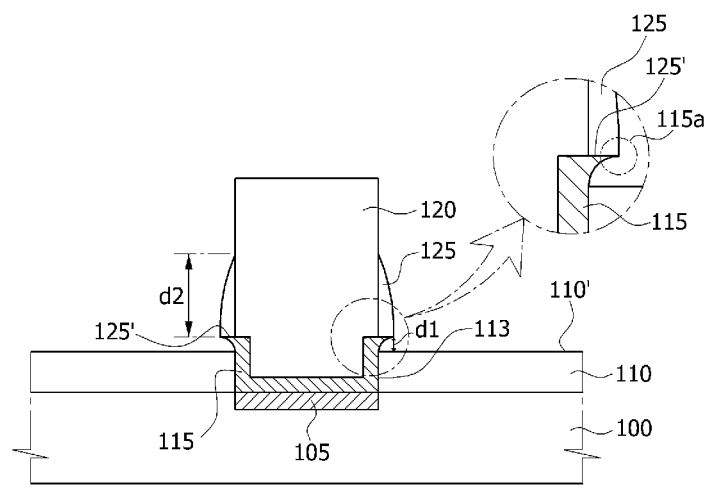
FIG. 1 is a cross sectional view illustrating a bump structure according to an embodiment of the present invention.

Referring to FIG. 1, a bump structure according to an embodiment of the present invention may be configured to include a metal post 120 and a metal pattern 115. The metal post 120 and the metal pattern 115 may constitute a body of the bump structure. The metal pattern 115 may surround a bottom surface and a lower sidewall of the metal post 120. The metal pattern 115 may be disposed between the metal post 120 and an electrode pad 105 on a substrate 100 to improve the adhesive strength between the electrode pad 105 and the metal post 120. The metal pattern 115 may have a cylindrical shape including a vertical sidewall surrounding the lower sidewall of the metal post 120 and a base portion contacting the bottom surface of the metal post 120. The electrode pad 105 may be disposed on a top surface of the substrate 100 and may be exposed by an opening 113 that penetrates an insulation layer 110 covering the top surface of the substrate 100. The metal pattern 115 may be disposed to cover the exposed electrode pad 105 and a sidewall of the opening 113. The metal pattern 115 may extend to a top surface 110' of the insulation layer 110 adjacent to the opening 113 and may continue to upwardly apart from the top surface 110' of the insulation layer 110 by a predetermined height d1. Further, the metal pattern 115 may laterally extend to outwardly protrude from the sidewall of the metal post 120. As a result, the sidewall of the metal pattern 115 has a protrusion 115a that outwardly extends from the sidewall of the metal post 120. The metal post 120 may be electrically connected to the electrode pad 105 on the substrate 100 through the metal pattern 115. The metal post 120 may include a metal material such as copper. The metal pattern 115 may include at least one of titanium (Ti), chrome (Cr), copper (Cu), nickel (Ni), gold (Au), and aluminum (Al).

The bump structure according to the present embodiment may further include a passivation spacer 125 disposed on the sidewall of the metal post 120. The passivation spacer 125 may be disposed to cover an intermediate sidewall d2 of the metal post 120 and to expose an upper sidewall of the metal post 120. The passivation spacer 125 may be disposed on an edge of the metal pattern 115 that laterally protrudes from the intermediate sidewall d2 of the metal post 120. The protrusion 115a of the metal pattern 115 contact with a bottom surface 125' of the passivation spacer 125. The passivation spacer 125 may include an insulation material such as oxide. The passivation spacer 125 may cover a portion of the sidewall of the metal post 120 to act as an etch barrier layer in a subsequent etch process. That is, the passivation spacer 125 may prevent a portion of the sidewall of the metal post 120 from being recessed or etched. Therefore, the passivation spacer 125 may prevent formation of an undercut region in the metal post 120. As a result, the metal post 120 may have a vertical pillar shape even after a subsequent etch process is performed. An outer sidewall of the passivation spacer 125 may have a profile such that a horizontal width of the passivation spacer 125 is reduced toward an upper end thereof.

Figure 14:
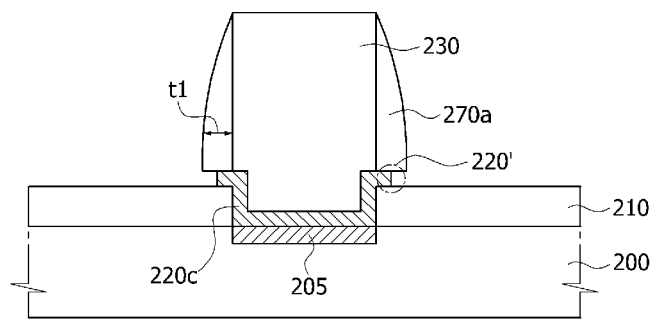
FIG. 14 is a cross sectional view illustrating a bump structure according to the other embodiment of the present invention.

Also, a protrusion 220' of a metal pattern 220c also may laterally extends from the sidewall of the metal post 230 with the increase of a thickness t1 of a passivation spacer 270a as shown in FIG. 14. FIG. 14 also illustrates substrate 200, electrode pad 205, insulation layer 210 and metal post 230.

Figure 2:
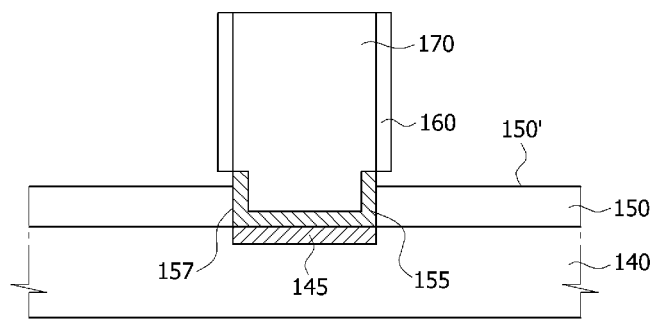
FIG. 2 is a cross sectional view illustrating a bump structure according to another embodiment of the present invention.

Referring to FIG. 2, a bump structure according to another embodiment of the present invention may be configured to include a metal post 170 and a metal pattern 155. The metal post 170 and the metal pattern 155 may constitute a body of the bump structure. The metal pattern 155 may surround a bottom surface and a lower sidewall of the metal post 170. The metal pattern 155 may be disposed to contact an electrode pad 145 on a substrate 140. The electrode pad 145 may be disposed on a top surface of the substrate 140 and may be exposed by an opening 157 that penetrates an insulation layer 150 covering the top surface of the substrate 140. The metal pattern 155 may extend to cover a bottom surface and a sidewall of the opening 157 that exposes the electrode pad 145. The metal pattern 155 may further extend to upwardly protrude from a top surface 150' of the insulation layer 150. In addition, the metal pattern 155 may be vertically aligned with the metal post 170 such that an outer sidewall of the metal pattern 155 is located in a vertical plane extending to the upper sidewall of the metal post 170.

The bump structure according to the present embodiment may further include a passivation spacer 160 disposed on the upper sidewall of the metal post 170. The passivation spacer 160 may be disposed to cover the upper sidewall of the metal post 170 and to expose the outer sidewall of the metal pattern 155. The passivation spacer 160 may include an insulation material such as oxide. An outer sidewall of the passivation spacer 160 may also have a profile such that the horizontal width of the passivation spacer 160 is reduced toward an upper end thereof.

Hereinafter, methods of fabricating bump structures according to some embodiments will be described with reference to the accompanying drawings.

Figure 3:
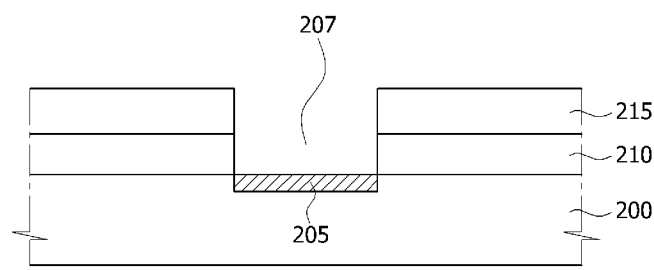
FIGS. 3 to 10 are cross sectional views illustrating a method of fabricating a bump structure according to an embodiment of the present invention.

Referring to FIG. 3, a substrate 200 including a semiconductor chip may be provided. The substrate 200 may correspond to a wafer. An electrode pad 205 may be formed on the substrate 200. An insulation layer 210 may be formed on the substrate 200 and the electrode pad 205. A mask pattern 215 may be formed on a surface of the insulation layer 210 opposite to the substrate 200. The mask pattern 215 may be formed by coating a photoresist layer on the insulation layer 210 and by patterning the photoresist layer using an exposure step and a development step of a lithography process. That is, the mask pattern 215 may be formed to have an opening that exposes a portion of the insulation layer 210. Subsequently, the exposed portion of the insulation layer 210 may be etched using the mask pattern 215 as an etch mask, thereby forming an opening 207 (or a trench) that exposes the electrode pad 205. The mask pattern 215 may be removed after formation of the opening 207.

Figure 4:
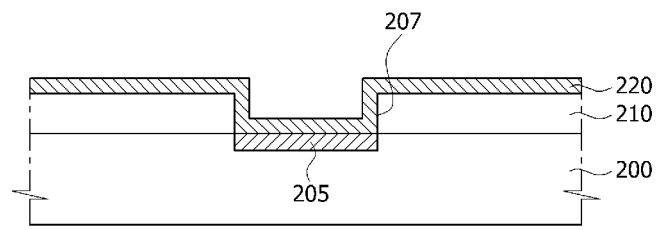

Referring to FIG. 4, a metal film 220 may be formed on the insulation layer 210 including the opening 207. The metal film 220 may be uniformly formed to cover a sidewall and a bottom surface of the opening 207 and to cover a top surface of the insulation layer 210. The metal film 220 may be formed of at least one of titanium (Ti), chrome (Cr), copper (Cu), nickel (Ni), gold (Au), and aluminum (Al) using an electroplating process or an electroless plating process. The metal film 220 may act as a metal seed layer when a metal post is formed in a subsequent process and may improve the adhesive strength between the electrode pad 205 and the metal post.

Figure 5:
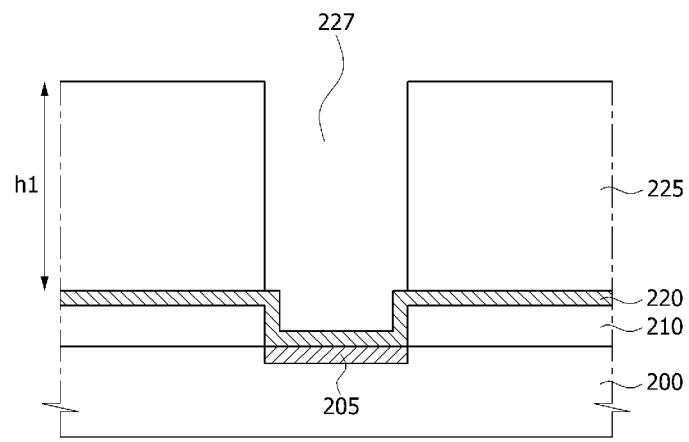

Referring to FIG. 5, a mask pattern 225 may be formed on the metal film 220. The mask pattern 225 may be formed to include a photoresist material. A thickness h1 of the mask pattern 225 may be determined in consideration of the height of the bump structure. Specifically, the mask pattern 225 may be formed by coating a photoresist layer on the metal film 220 and patterning the photoresist layer using an exposure step and a development step of a lithography process. As a result, the mask pattern 225 may be formed to include an opening 227 that exposes a portion of the metal film 220. Although the present embodiment has one opening, notably, opening 227, two or more openings 227 may be formed adjacent to each other.

Figure 6:
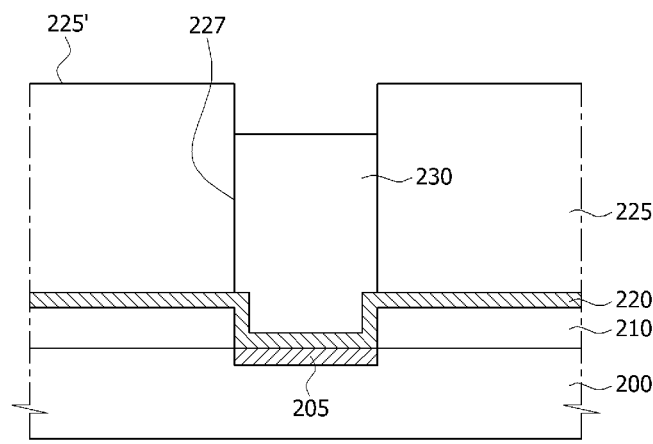

Referring to FIG. 6, a metal post 230 may be formed on the metal film 220 which is exposed by the opening 227 in the mask pattern 225. The metal post 230 may be formed to contact the metal film 220 and to fill the opening 227 in the mask pattern 225. The metal post 230 may be formed to have a thickness (e.g., a vertical height) which is greater than a thickness (h1 of FIG. 5) of the mask pattern 225. As a result, the metal post 230 may be formed to protrude from a top surface 225' of the mask pattern 225. The metal post 230 may be formed to include copper. The metal post 230 may be formed using an electroplating process or an electroless plating process.

Figure 7:
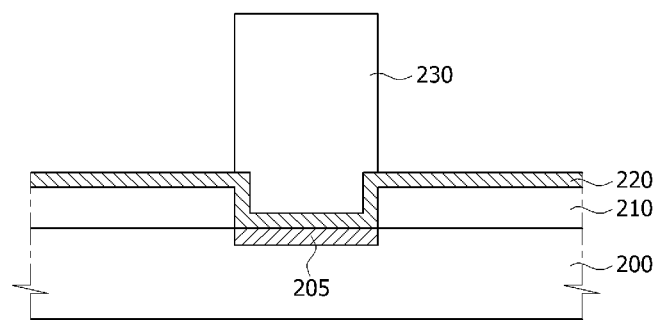

Referring to FIG. 7, the mask pattern 225 may be removed to expose the metal film 220 on the insulation layer 210 and an outer sidewall of the metal post 230. If the mask pattern 225 is formed of a photoresist layer, the mask pattern 225 may be removed using a plasma ashing process or a developer.

Figure 8:
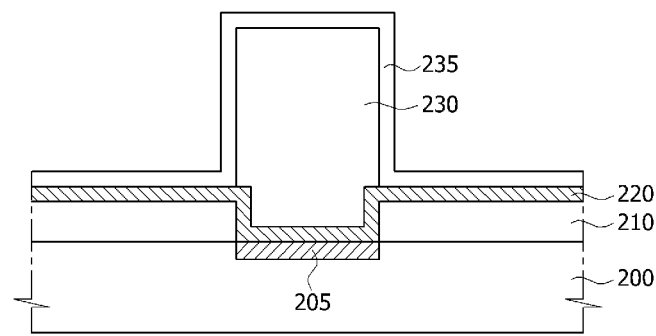

Referring to FIG. 8, a passivation layer 235 may be formed on an exposed surface of the metal post 230 and an exposed surface of the metal film 220. In other words, the passivation layer 235 may be uniformly formed along a surface profile of the metal post 230 and the metal film 220. The passivation layer 235 may be formed to include an oxide layer. In such a case, the oxide layer may be formed using a wet oxidation process performed in water vapor or a dry oxidation process performed in oxygen plasma. The passivation layer 235 may act as a protection layer that prevents a lower portion of the metal post 230 from being over-etched when the metal film 220 is removed in a subsequent etching process. That is, the passivation layer 235 may prevent undercut regions from being formed in the metal post 230 when the metal film 220 is removed in a subsequent etching process.

Figure 9:
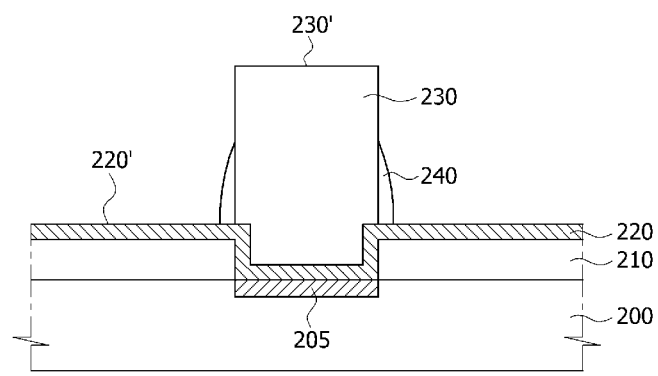

Referring to FIG. 9, the passivation layer 235 may be etched back to form a passivation spacer 240 on the sidewall of the metal post 230. The passivation spacer 240 may be formed by applying a dry etching process to the passivation layer 235. The dry etching process used in etching back the passivation layer 235 may be an anisotropic etching process exhibiting a property that a vertical etch rate is faster than a lateral etch rate. Accordingly, when the anisotropic etching process is applied to the passivation layer 235, a vertical etch rate of the passivation layer 235 on a top surface 230' of the metal post 230 and on a top surface 220' of the metal film 220 may be faster than a lateral etch rate of the passivation layer 235 on the sidewall of the metal post 230. As a result, after the passivation layer 235 is anisotropically etched, the passivation layer 235 on the top surface 230' of the metal post 230 and on the top surface 220' of the metal film 220 may be completely removed and the passivation layer 235 on the sidewall of the metal post 230 may be partially left to form the passivation spacer 240. In such a case, an upper sidewall of the metal post 230 may be exposed, and an intermediate sidewall of the metal post 230 may be surrounded and covered with the passivation spacer 240.

Figure 10:
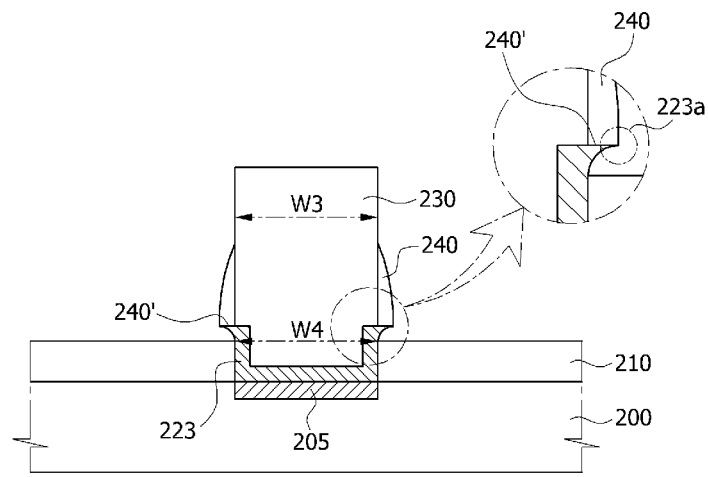

Referring to FIG. 10, the metal film 220 on the insulation layer 210 may be removed to expose a top surface of the insulation layer 210 and to form a metal pattern 223 surrounding the lower portion of the metal post 230. The metal film 220 on the insulation layer 210 may be removed using a wet etching process that employs a wet etch source reacting on the metal film 220 as an etchant. The etch time of the wet etch process for removing the metal film 220 may be increased to over-etch the metal film 220 and to prevent residues of the metal film 220 from being left. The wet etch process may correspond to an isotropic etch process exhibiting a property that a vertical etch rate is substantially equal or similar to a lateral etch rate.

Figure 11:
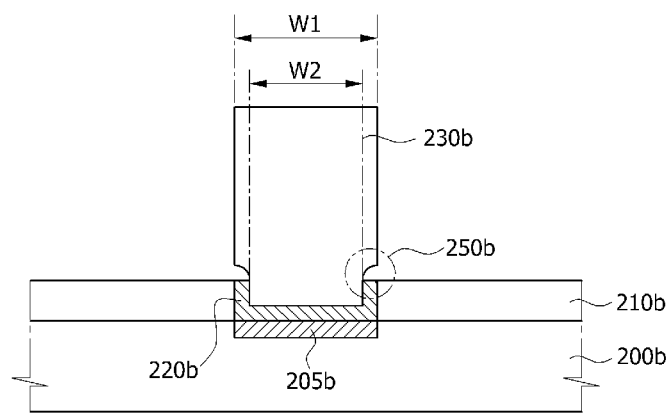
FIG. 11 is a cross sectional view illustrating an undercut region formed in a general bump structure.

If the wet etch process for removing the metal film 220 on the insulation layer 210 is performed without the passivation spacer 240 covering the intermediate sidewall of the metal post 230 (e.g., a lower sidewall of the protruded portion of the metal post 230), the lower sidewall of the protruded portion of the metal post 230 may be exposed to an etchant during the wet etch process. In such a case, the metal film 220 surrounding a lower portion of the metal post 230b may be more readily etched during the isotropic wet etch process and the metal post 230b may also be laterally etched to form an undercut region 250b in the metal post 230b and to form a metal pattern 220b as illustrated in FIG. 11.

As described above, if the undercut region 250b is formed in the metal post 230b, a lower width W2 of the protruded portion of the metal post 230b at which the undercut region cuts the metal post 230b the most laterally may be less than an upper width W1 of the protruded portion of the metal post 230b. That is, a horizontal cross sectional area of the lower portion of the protruded portion of the metal post 230b may be abruptly reduced, thereby increasing an electrical contact resistance between the protruded portion of the metal post 230b and the underlying pattern (e.g., the metal pattern 220b). This may lead to degradation of the reliability of the semiconductor package including the undercut region 250b. Particularly, as the semiconductor chips become more highly integrated, the metal post 230b has scaled down.

Thus, it may be important to control the undercut region 250b in terms of the reliability of the semiconductor packages.

According to the embodiments, as illustrated in FIG. 10, the metal film 220 on the insulation layer 210 may be removed using a wet etch process after formation of the passivation spacer 240 covering the sidewall of the metal post 230. If the wet etch process is performed after formation of the passivation spacer 240, the passivation spacer 240 may protect the lower sidewall of the protruded portion of the metal post 230 to prevent the undercut region (250b of FIG. 11) from being formed in the metal post 230. That is, the passivation spacer 240 may act as an etch barrier layer to prevent an etchant from infiltrating into the metal post 230 during the wet etch process for removing the metal film 220 on the insulation layer 210. The etchant may include a chemical solution reacting on the metal film 220. The metal pattern 223 fabricated using the wet etch process may be formed to outwardly protrude from the vertical sidewall of the metal post 230. As a result, the sidewall of the metal pattern 223 has a protrusion 223a that outwardly extends from the sidewall of the metal post 230. Also, the protrusion 223a of the metal pattern 223 contact on a bottom surface 240' of the passivation spacer 240.

The bump structure according to some embodiments may be formed to have a pillar shape including the metal post 230 and the metal pattern 223 which contacts a bottom surface of the metal post 230, as illustrated in FIG. 10. A width W3 of the metal post 230 may be substantially equal or similar to a width W4 of the metal pattern 223. The width W3 of the metal post 230 also may be substantially wider or narrower to the width W4 of the metal pattern 223. Although not shown in the drawings, a semiconductor package including the bump structure illustrated in FIG. 10 may be mounted on a printed circuit board (PCB) using an assembly process.

Figure 12:
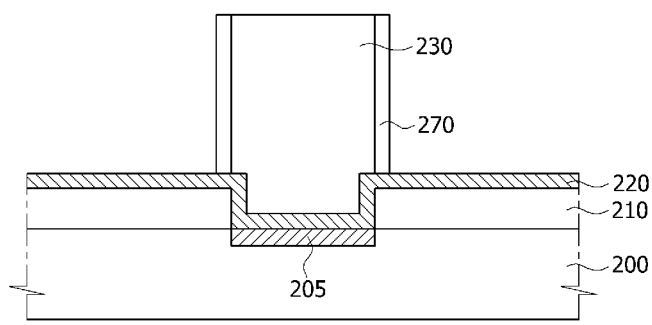
FIGS. 12 to 13 are cross sectional views illustrating a method of fabricating a bump structure according to another embodiment of the present invention.
Figure 13:
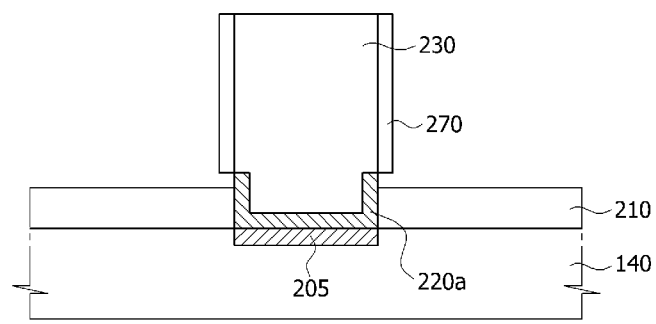

The area of the sidewall of the metal post 230 covered with a passivation spacer may be controlled by adjusting an etch time of an anisotropic etch process applied to the passivation layer 235. Referring to FIG. 12, a passivation spacer 270 may be formed to cover an entire sidewall of a protruded portion of the metal post 230. Subsequently, if a wet etch process for selectively removing the metal film 220 on the insulation layer 210 is performed after formation of the passivation spacer 270 covering the entire sidewall of the protruded portion of the metal post 230, a metal pattern 220a surrounding a lower portion of the metal post 230 may be formed as illustrated in FIG. 13. Even in such a case, the passivation spacer 270 may act as a protection layer to prevent an undercut region (250b of FIG. 11) from being formed in the metal post 230.

The embodiments of the present invention have been disclosed above for illustrative purposes. Those skilled in the art will appreciate that various modifications, additions and substitutions are possible, without departing from the scope and spirit of the present invention as disclosed in the accompanying claims.

What is claimed is:

1. A method of fabricating a bump structure, the method comprising:
    forming an insulation layer on a substrate, the insulation layer being formed to include an opening that exposes an electrode pad on the substrate;
    forming a metal film on the insulation layer and on the opening of the insulation layer;
    forming a mask pattern on the metal film, the mask pattern being formed to include an opening that exposes the metal film on the electrode pad;
    forming a metal post on the metal film exposed by the opening of the mask pattern;
    forming a passivation spacer on a sidewall of the metal post; and
    removing the metal film on the insulation layer to form a metal pattern having a vertical sidewall on the electrode pad,
    wherein the vertical sidewall of the metal pattern is formed to include a protrusion that outwardly extends from a sidewall of the metal post.

2. The method of claim 1, wherein the mask pattern is formed of a photoresist material.

3. The method of claim 2, wherein the metal post is formed to include copper.

4. The method of claim 2, wherein forming the passivation spacer includes:
    removing the mask pattern;
    forming a passivation layer on the metal film and the metal post; and
    etching back the passivation layer to leave a portion of the passivation layer on the sidewall of the metal post.

5. The method of claim 4, wherein the passivation layer is formed to include an oxide layer.

6. The method of claim 1, wherein the protrusion of the vertical sidewall of the metal pattern is formed to laterally extend from the sidewall of the metal post.

7. The method of claim 2, wherein the passivation spacer is formed to cover a portion of the sidewall of the metal post.

8. The method of claim 2, wherein an outer sidewall of the passivation spacer is formed to have a profile such that a horizontal width of the passivation spacer is reduced toward an upper end thereof.

9. The method of claim 2, wherein the passivation spacer is formed to cover an entire portion of the sidewall of the metal post.

* * * * *